United States Patent
Paolucci

(10) Patent No.: US 12,210,769 B2
(45) Date of Patent: Jan. 28, 2025

(54) BALANCED CORRECTIVE READ FOR ADDRESSING CELL-TO-CELL INTERFERENCE

(71) Applicant: Micron Technology, Inc., Boise, ID (US)

(72) Inventor: Giovanni Maria Paolucci, Milan (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/228,065

(22) Filed: Jul. 31, 2023

(65) Prior Publication Data
US 2024/0069792 A1    Feb. 29, 2024

Related U.S. Application Data

(60) Provisional application No. 63/400,801, filed on Aug. 25, 2022.

(51) Int. Cl.
*G06F 3/06* (2006.01)

(52) U.S. Cl.
CPC .......... *G06F 3/0655* (2013.01); *G06F 3/0604* (2013.01); *G06F 3/0679* (2013.01)

(58) Field of Classification Search
CPC .... G06F 3/0655; G06F 3/0604; G06F 3/0679; G06F 3/0619; G06F 3/0644; G11C 11/5642; G11C 16/26; G11C 16/3427
See application file for complete search history.

(56) References Cited

U.S. PATENT DOCUMENTS

| | | | | |
|---|---|---|---|---|
| 2003/0086366 | A1* | 5/2003 | Branlund | H04W 72/0453 375/150 |
| 2013/0155776 | A1* | 6/2013 | Chilappagari | G11C 16/3427 365/185.24 |
| 2022/0164263 | A1* | 5/2022 | Liikanen | G11C 16/3436 |
| 2023/0352098 | A1* | 11/2023 | Ganesh Rao | G11C 16/30 |
| 2023/0360696 | A1* | 11/2023 | Tseng | G11C 11/4085 |

* cited by examiner

*Primary Examiner* — Francisco A Grullon
(74) *Attorney, Agent, or Firm* — Lowenstein Sandler LLP

(57) ABSTRACT

A memory device includes a memory array and control logic to perform operations including identifying a target cell and a set of cells adjacent to the target cell. Each cell of the set of cells is associated with a respective adjacent cell state. The operations further include determining, for each adjacent cell state, a respective interference value, assigning, based on the respective interference value, each adjacent cell state to a respective bin of a set of state information bins, and in response to determining that each bin of the set of state information bins has at least one adjacent cell state assigned to it, and determining a set of read level offsets for reading the target cell. Each read level offset of the set of read level offsets is associated with a respective bin of the set of state information bins.

20 Claims, 11 Drawing Sheets

BALANCED CORRECTIVE READ FOR ADDRESSING CELL-TO-CELL INTERFERENCE

CROSS-REFERENCE TO RELATED APPLICATION(S)

The present application claims the benefit of U.S. Provisional Application 63/400,801, filed on Aug. 25, 2022 and entitled "BALANCED CORRECTIVE READ FOR ADDRESSING CELL-TO-CELL INTERFERENCE", the entire contents of which are incorporated by reference herein.

TECHNICAL FIELD

Embodiments of the disclosure relate generally to memory sub-systems, and more specifically, relate to balanced corrective read for addressing cell-to-cell interference.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1A:
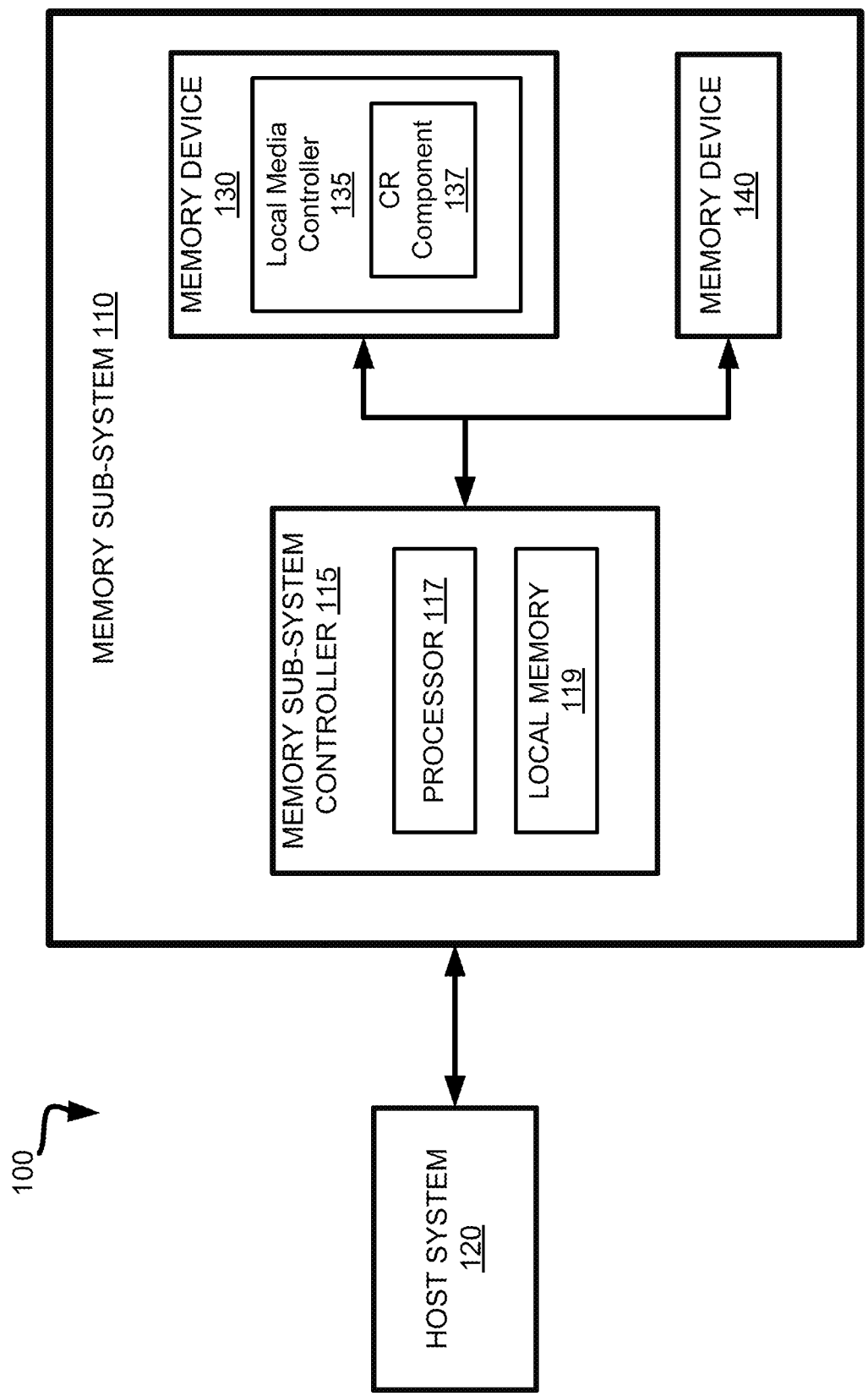
FIG. 1A illustrates an example computing system that includes a memory sub-system, in accordance with some embodiments of the present disclosure.

Aspects of the present disclosure are directed to implementing balanced corrective reads for addressing cell-to-cell interference. A memory sub-system can be a storage device, a memory module, or a combination of a storage device and memory module. Examples of storage devices and memory modules are described below in conjunction with FIGS. 1A-1B. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIGS. 1A-1B. A non-volatile memory device is a package of one or more dies. Each die includes one or more planes. For some types of non-volatile memory devices (e.g., NAND devices), each plane includes a set of physical blocks. Each block consists of a set of pages. Each page includes a set of memory cells. A memory cell is an electronic circuit that stores information. Depending on the memory cell type, a memory cell can store one or more bits of binary information, and has various logic states that correlate to the number of bits being stored. The logic states can be represented by binary values, such as "0" and "1", or combinations of such values.

A memory device can include multiple memory cells arranged in a two-dimensional or three-dimensional grid. The memory cells are formed onto a silicon wafer in an array of columns (also hereinafter referred to as bitlines) and rows (also hereinafter referred to as wordlines). A wordline can refer to one or more conductive lines of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types. For ease of description, these circuits can be generally referred to as independent plane driver circuits. Control logic on the memory device includes a number of separate processing threads to perform concurrent memory access operations (e.g., read operations, program operations, and erase operations). For example, each processing thread corresponds to a respective one of the memory planes and utilizes the associated independent plane driver circuits to perform the memory access operations on the respective memory plane. As these processing threads operate independently, the power usage and requirements associated with each processing thread also varies.

Some memory devices can be three-dimensional (3D) memory devices (e.g., 3D NAND devices). For example, a 3D memory device can include memory cells that are placed between sets of layers including a pillar (e.g., polysilicon pillar), a tunnel oxide layer, a charge trap (CT) layer, and a dielectric (e.g. oxide) layer. A 3D memory device can have a "top deck" corresponding to a first side and a "bottom deck" corresponding to a second side. Without loss of generality, the first side can be a drain side and the second side can be a source side. For example, a 3D memory device can be a 3D replacement gate memory device having a replacement gate structure using wordline stacking.

A memory cell ("cell") can be programmed (written to) by applying a certain voltage to the cell, which results in an electric charge being held by the cell. For example, a voltage signal $V_{CG}$ that can be applied to a control electrode of the cell to open the cell to the flow of electric current across the cell, between a source electrode and a drain electrode. More specifically, for each individual cell (having a charge Q stored thereon) there can be a threshold control gate voltage $V_T$ (also referred to as the "threshold voltage") such that the source-drain electric current is low for the control gate voltage ($V_{CG}$) being below the threshold voltage, $V_{CG}<V_T$. The current increases substantially once the control gate voltage has exceeded the threshold voltage, $V_{CG}>V_T$. Because the actual geometry of the electrodes and gates varies from cell to cell, the threshold voltages can be different even for cells implemented on the same die. The cells can, therefore, be characterized by a distribution P of the threshold voltages, $P(Q,V_T)=dW/dV_T$, where dW represents the probability that any given cell has its threshold voltage within the interval $[V_T, V_T+dV_T]$ when charge Q is placed on the cell.

A memory device can exhibit threshold voltage distributions $P(Q,V_T)$ that are narrow compared with the working range of control voltages tolerated by the cells of the device. Accordingly, multiple non-overlapping distributions $P(Q_k, V_T)$ can be fit into the working range allowing for storage and reliable detection of multiple values of the charge $Q_k$, k=1, 2, 3 . . . . The distributions are interspersed with voltage intervals ("valley margins") where none (or very few) of the cells of the device have their threshold voltages. Such valley margins can, therefore, be used to separate various charge states $Q_k$—the logical state of the cell can be determined by detecting, during a read operation, between which two valley margins the respective threshold voltage $V_T$ of the cell resides. Specifically, the read operation can be performed by comparing the measured threshold voltage $V_T$ exhibited by the memory cell to one or more reference voltage levels corresponding to known valley margins (e.g., centers of the margins) of the memory device.

One type of cell is a single level cell (SLC), which stores 1 bit per cell and defines 2 logical states ("states") ("1" or "L0" and "0" or "L1") each corresponding to a respective $V_T$ level. For example, the "1" state can be an erased state and the "0" state can be a programmed state (L1). Another type of cell is a multi-level cell (MLC), which stores 2 bits per cell and defines 4 states ("11" or "L0", "10" or "L1", "01" or "L2" and "00" or "L3") each corresponding to a respective $V_T$ level. For example, the "11" state can be an erased state and the "01", "10" and "00" states can each be a respective programmed state. Another type of cell is a triple level cell (TLC), which stores 3 bits per cell and defines 8 states ("111" or "L0", "110" or "L1", "101" or "L2", "100" or "L3", "011" or "L4", "010" or "L5", "001" or "L6", and "000" or "L7") each corresponding to a respective $V_T$ level. For example, the "111" state can be an erased state and each of the other states can be a respective programmed state. Another type of a cell is a quad-level cell (QLC), which stores 4 bits per cell and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. A memory device can include one or more arrays of memory cells such as SLCs, MLCs, TLCs, QLCs, PLCs, etc. or any combination of such. For example, a memory device can include an SLC portion, and an MLC portion, a TLC portion, a QLC portion, or a PLC portion of cells.

A valley margin can also be referred to as a read window. For example, in a SLC cell, there is 1 read window that exists with respect to the 2 $V_T$ distributions. As another example, in an MLC cell, there are 3 read windows that exist with respect to the 4 $V_T$ distributions. As yet another example, in a TLC cell, there are 7 read windows that exist with respect to the 8 $V_T$ distributions. Read window size generally decreases as the number of states increases. For example, the 1 read window for the SLC cell may be larger than each of the 3 read windows for the MLC cell, and each of the 3 read windows for the MLC cell may be larger than each of the 7 read windows for the TLC cell, etc. Read window budget (RWB) refers to the cumulative value of the read windows.

Cells of a memory array that are selected to be read during a read operation can be referred to as "target cells" addressable by (e.g., connected to) a target wordline. A given target cell can neighbor adjacent cells addressable by at least one wordline neighboring the target wordline ("adjacent wordline"). For example, the at least one adjacent wordline can include a single wordline neighboring the target wordline (e.g., a wordline located directly above or directly below the target wordline) or a pair of wordlines neighboring the target wordline (e.g., a wordline located directly above the target wordline and another wordline located directly below the target wordline. Illustratively, the target wordline can be referred to as an n-th wordline ($WL_n$), and a wordline that is adjacent to the target wordline can include at least one of adjacent wordline n−1 ($WL_{n-1}$) or adjacent wordline n+1 ($WL_{n+1}$).

Each target cell has a respective group of adjacent cells. Each group of adjacent cells includes at least one cell that neighbors its respective target cell (e.g., one cell addressable by $WL_{n-1}$ and/or one cell addressable by $WL_{n+1}$). More specifically, a given target cell can be connected to the same bitline as each cell of its group of adjacent cells, such that the target cell and the cells of the respective group of adjacent cells are within the same string. Accordingly, each group of adjacent cells can include a single adjacent cell, or a pair of adjacent cells addressable by a same bitline as a respective target cell.

A read operation can include a prologue phase during which a controller activates voltage pumps (e.g., causes voltage pumps to be turned on) and loads information for the read operation, a strobe phase in which a number of strobes are performed, and an epilogue phase during which the controller causes the cells to discharge, deactivates the voltage pumps (e.g., causes the voltage pumps to be turned off) and causes the memory device to return to an idle or standby state (e.g., depending on the state of the CE #signal). A strobe refers to a read performed at a particular read level offset (e.g., by applying the read level offset to a base read level). For example, for a 3 strobe page type, a 3 strobe read can be performed during the strobe phase.

One example of a programming techniques is one-pass programming. During one-pass programming, cells addressable by a particular wordline are programmed using a single programming operation ("one pass"). Thus, all of the bits of programming information are reported to the memory device (e.g., NAND) during the single programming operation. For example, in TLC implementations in which there are eight total cell states L0-L7 and each cell maintains three bits of programming information, the cells addressable by a particular wordline are programmed during the single programming operation and the three bits of information for each cell addressable by the particular wordline are reported to the memory device.

Another example of a programming technique is two-pass programming. During two-pass programming, cells addressable by a particular wordline are programmed using two programming operations ("two passes"). Each pass performed during two-pass programming with respect to a particular wordline generates a respective set of $V_T$ distributions of the cells addressable by the particular wordline. More specifically, during the first pass, an initial set of $V_T$ distributions is generated and an initial set of bits of programming information is reported. The initial set of bits of programming information can include a number of bits less than or equal to the total number of bits of programming information (e.g., less than or equal to eight bits for a TLC implementation). During the second pass, a final set of $V_T$ distributions is generated and a final number of bits of programming information is reported. The final set of bits of programming information includes a number of bits equal to the total number of bits of programming information (e.g., equal to eight bits for a TLC implementation).

Two-pass programming can be performed on cells addressable by respective wordlines using a two-pass programming sequence that proceeds in an alternating (e.g., zig-zag) fashion with respect to the wordlines. For example, the two-pass programming sequence can proceed in a zig-zag fashion with respect to the wordlines. As an illustrative example of two-pass programming, assume that a controller initiates two-pass programming to program cells addressable by a number of wordlines including wordlines $W_{n-1}$ through $W_{n+2}$. The controller can perform a first pass on the cells addressable by wordline $W_{n-1}$. After performing the first pass on the cells addressable by wordline $W_{n-1}$, the controller can proceed to perform a first pass on the cells addressable by wordline $W_n$. After performing the first pass on the cells addressable by wordline $W_n$, the controller can proceed to perform a second pass on the cells addressable by wordline $W_{n-1}$. After performing the second pass on the cells addressable by wordline $W_{n-1}$, the controller can proceed to perform a first pass on the cells addressable by wordline $W_{n+1}$. After performing the first pass on the cells addressable by wordline $W_{n+1}$, the controller can proceed to perform a second pass on the cells addressable by wordline $W_n$. After performing the second pass on the cells addressable by wordline $W_n$, the controller can proceed to perform a first pass on the cells addressable by wordline $W_{n+2}$. After performing the first pass on the cells addressable by wordline $W_{n+2}$, the controller can proceed to perform a second pass on the cells addressable by wordline $W_{n+1}$. This alternating two-pass programming scheme can continue in a similar manner to program the remaining wordlines.

Two-pass programming can be referred to generally as "m-n" programming, where m is less than or equal to n. Here, m refers to the number of $V_T$ distributions obtained during the first pass of programming cells addressable by a particular wordline, and n refers to the number of $V_T$ distributions obtained after the second pass of programming cells addressable by the particular wordline (i.e., the total number of $V_T$ distributions). More specifically, each of the m $V_T$ distributions generated during the first pass is used to generate one or more of the n $V_T$ distributions during the second pass. For example, in TLC implementations in which there are eight total cell states L0-L7 and each cell maintains three bits of programming information, two-pass programming can be generally referred to as "m-8" programming, where $m \in [1,8]$.

Illustratively, during 2-8 programming of TLC cells, two initial $V_T$ distributions including an initial erase $V_T$ distribution and an initial $V_T$ programming distribution are obtained during the first pass (and one bit is reported to the memory device), and eight final $V_T$ distributions each corresponding to a respective state L0-L7 are obtained during the second pass (and the remaining two bits are reported to the memory device). For example, the final $V_T$ distribution for each of states L0-L3 can be obtained by reprogramming the cells of the initial $V_T$ erase distribution and the final $V_T$ distribution for each of the states L4-L7 can be obtained by reprogramming the cells of the initial $V_T$ programming distribution. Similarly, during 4-8 programming of TLC cells, four initial $V_T$ distributions are obtained during the first pass (and two bits are reported to the memory device), and the eight final $V_T$ distributions are obtained during the second pass (and the remaining one bit is reported to the memory device). During 8-8 programming of TLC cells, eight initial $V_T$ distributions are obtained during the first pass (and three bits are reported to the memory device), and the eight final $V_T$ distributions are obtained during the second pass (and three bits are reported again to the memory device).

Cell-to-cell interference ("interference") can be measured between a target cell addressable by a target wordline and at least one adjacent cell, neighboring the target cell, addressable by at least one adjacent wordline. Interference refers to the effect that the charges stored in the charge trapping material of a cell in a programming state has on the $V_T$ distribution of a target cell in a programming state. Lateral charge migration refers to the movement of charge from the charge trapping material of one cell to the charge trapping material of another cell (e.g., charge leakage).

Interference and/or lateral charge migration can negatively affect memory device reliability. For example, interference and/or lateral charge migration can cause $V_T$ distribution widening and RWB degradation, which can lead to an increase in the number of errors (e.g., bit errors) and/or error rate (e.g., bit error rate (BER)).

The target cell can have a particular target cell state and each adjacent cell can have a respective adjacent cell state. For example, for a particular target cell state, interference can be measured for each adjacent cell state by determining how the upper tail of the target cell $V_T$ distribution is impacted by adjacent cells having the adjacent cell state. For example, the more that a set of target cells is aggressed by a set of adjacent cells, the more the upper tail of the distribution of target cells will be upward shifted. Illustratively, for TLC cells, interference can be measured between each set of adjacent cells having a respective adjacent cell state L0-L7, and target cells having a particular state (e.g., L1).

One mechanism to compensate for interference is corrective read. Generally, a corrective read operation is performed to read a target cell using an appropriate read level offset that accounts for the interference caused by the cell state(s) (e.g., logical level(s)) of its respective group of adjacent cells (e.g., single cell or pair of cells). The read level offset can be applied with respect to a center read level. For example, the center read level can be located within a valley between target cell $V_T$ distributions.

The read level offset applied to a target cell can be defined by a cell state information bin ("bin") to which the target cell is assigned. Each bin can define a respective grouping of target cells based on adjacent cell states. For example, in the single adjacent cell case, a bin can define a set of logical levels (e.g., a subset of the total number of logical levels Ln), and a controller can assign a target cell to a bin if its adjacent cell has a logical level that falls within the set of logical levels. As another example, in the pair of adjacent cell case, a bin can define a first set of logical levels and a second set of logical levels. The controller can then assign a target cell to the bin if a first cell of its pair of adjacent cells has a logical level that falls within the first set of logical levels and a second cell of its pair of adjacent cells has a logical level that falls within the second set of logical levels. During a read operation, the controller can apply the same read level offset to target cells that are assigned to the same bin. The read level offset assigned to a bin can be empirically determined through observation or experimentation regarding the effect that adjacent cell(s) with varying states have on respective target cells. Thus, the bin assignments and corresponding read level offsets can be predefined within a data structure (e.g., table) maintained within the memory device for implementing corrective read. The data structure can be stored in a metadata area of the memory device.

To identify the state of an adjacent cell, the controller can cause a read voltage to be applied the adjacent cell (e.g., gate electrode of the cell) and determine whether the read voltage activates (e.g., turns on) the adjacent cell. If the read voltage activates the adjacent cell, this indicates that the read voltage is greater than or equal to the $V_T$ of the adjacent cell. Additional read voltage(s) may be applied to the adjacent cell to determine whether the cell is in a lower state. If the read voltage does not activate the adjacent cell, this means that the read voltage is less than the $V_T$ of the adjacent cell, and that the adjacent cell is in a higher state. Additional read voltage(s) may be applied until the adjacent cell is activated. For each group of adjacent cells, the controller can store the cell state information for each cell of the group of adjacent cells in a respective page buffer (e.g., static page buffer). Each page buffer can be connected to a respective group of adjacent cells via a bitline.

In some embodiments, implementing corrective read can include obtaining 1-bit cell state information. For example, obtaining 1-bit cell state information can include applying a single strobe read with respect to least one adjacent wordline (e.g., cells connected to at least one of the adjacent wordlines $WL_{n-1}$ or $WL_{n+1}$). A strobe refers to a read performed at a particular read level offset. If the adjacent cells are divided into two groups, then the stored cell state information is 1 bit in total. The 1-bit stored cell state information can be used to implement 1-bit corrective read (1BCR). If the adjacent cells are divided into four groups, then the stored cell state information is 2 bits in total. The 2-bit stored cell state information can be used to implement 2-bit corrective read (2BCR).

In some embodiments, implementing corrective read can include obtaining 2-bit cell state information. For example, obtaining 2-bit cell state information can include applying a three-strobe read with respect to at least one adjacent wordline. If the group of adjacent cells includes a single adjacent cell (e.g., a cell connected to one of the adjacent wordlines $WL_{n-1}$ and $WL_{n+1}$), then the stored cell state information is 2 bits in total. If the adjacent cells are divided into four groups, then the stored cell state information is 2 bits in total. The 2-bit stored cell state information can be used to implement 2BCR. If the adjacent cells are divided into 16 groups, then the stored cell state information is 4 bits in total. The 4-bit stored cell state information can be used to implement 4-bit corrective read (4BCR). If the adjacent cells are divided into 8 groups, then the stored cell state information can be 3 bits in total. The 3-bit stored cell state information can be used to implement 3-bit corrective read (3BCR).

The number of bins initialized for corrective read can be determined by the particular corrective read implementation (e.g., 1BCR, 2BCR 3BCR or 4BCR). For example, 1BCR can be implemented with two bins (e.g., in a TLC implementations, bin 1 is defined for L0-L3 adjacent cell states and bin is defined for L4-L7 adjacent cell states), and 2BCR can be implemented with four bins (e.g., in a TLC implementation, bin 1 is defined for L0/L1 adjacent cell states, bin 2 is defined for L2/L3 adjacent cell states, bin 3 is defined for L4/L5 adjacent cell states, and bin 4 is defined for L6/L7 adjacent cell states. A target cell adjacent to a group of cells can be assigned to an appropriate bin based on the cell state information condition of the group of cells.

The number of bits to perform corrective read for a particular cell type can be less than the maximum number of bits that can be supported for the particular cell type. It may be desirable to perform corrective read with a fewer number of bits than can be supported to reduce complexity (e.g., reduce the number of page buffers needed to store the bits). For example, for TLC implementations that can support up to 3BCR, instead of performing 3BCR, it may be desirable to perform 1BCR or 2BCR. As another example, for QLC implementations that support up to 4BCR, instead of performing 4BCR, it may be desirable to perform 1BCR, 2BCR or 3BCR. However, performing corrective read with fewer number of bits than can be supported for a particular cell type can reduce the corrective read efficiency due to the loss of some of this bit information.

In the case of one-pass programming, it can be observed that interference between target cells and cells adjacent to the target cells is a monotonically increasing function of adjacent cell state. For example, in a TLC implementation, an adjacent cell having an L0 state can have the least interference impact on the target cell due to having the fewest number of stored charges, while an adjacent cell having an L7 state can have the greatest interference impact on the target cell due to having the highest number of stored charges.

In the case of two-pass programming, it can be observed that interference between target cells and cells adjacent to the target cells is a non-monotonic function of the adjacent cell state. For example, for 2-8 programming of TLC cells, it can be observed that the interference impact on target cells increases from an adjacent cell state of L0 to an adjacent cell state of L3, decreases at an adjacent cell state of L4 (e.g., about the same amount of interference as L0), and then increases from the adjacent cell state L4 to an adjacent cell state of L7. Therefore, a grouping of target cells into an L0/L1 bin, an L2/L3 bin, an L4/L5 bin and an L6/L7 bin can lead to sub-optimal corrective read efficiency, at least with respect to addressing interference.

Aspects of the present disclosure address the above and other deficiencies by implementing balanced corrective read for cell-to-cell interference. For example, embodiments described herein can be used to improve the performance of corrective read in scenarios in which the number of bits used to perform the corrective read is less than the maximum number of bits that could be used to perform the corrective read. For example, if the cells of the memory device include TLC cells that can support performance of up to 3BCR, embodiments described herein can be applied to improve the performance of, e.g., 1BCR or 2BCR. As another example, if the cells of the memory device include QLC cells that can support performance of a maximum of up to 4BCR, then embodiments described herein can be applied to improve, e.g., 1BCR, 2BCR or 3BCR. Embodiments described herein can be applied to 1-pass programming implementations, 2-pass programming implementations, etc.

A memory array can include a target cell and a number of cells adjacent to the target cell ("adjacent cells"). The target cell can have a target cell state and each adjacent cell can have an adjacent cell state. To perform a balanced corrective read, a controller can determine, for each adjacent cell state, an interference value reflecting cell-to-cell interference ("interference") on the target cell. For example, the controller can cause, for each adjacent cell state, the interference value reflecting interference on the target cell to be measured. Interference can be caused by the displacement of one or more adjacent cells from an initial state to a final state, which in turn can cause a certain displacement of a target cell from its intended target cell state. In some embodiments, the interference value for each adjacent cell state can include a respective amount of interference between the target cell and the adjacent cell state.

The controller can then analyze the interference values to perform state information bin ("bin") assignment. Such bin assignment can improve corrective read efficiency, at least with respect to the interference. For example, the controller can initialize a set of bins, where each bin of the set of bins is empty. The controller can determine, for each bin of the set of bins, an interference interval. Each interference interval defines a subset of a range of interference values, where each interference value reflects an amount of interference on the target cell. The range can be defined by a maximum interference value and a minimum interference value. Each interference interval can have an equal width, where the width is determined by dividing the range by the number of bins (e.g., in a 2BCR implementation, dividing the range by four). The controller can then assign each adjacent cell level to a bin of the set of bins. More specifically, the controller can, for each adjacent cell level, identify which interference interval that the value reflecting interference on the target cell for the adjacent cell level is located, and assign the adjacent cell level to the respective bin associated with the interference interval. Accordingly, embodiments described herein can perform bin assignment by grouping, into respective bins, adjacent cell states determined to have similar amounts of interference with respect to a target cell.

Illustratively, assume a 2BCR TLC implementation in which there are eight cell states L0-L7 and four bins, Bin 0 through Bin 3, each having an associated interference value determined in the manner described above. If the interference value reflecting interference on the target cell for the L0 adjacent cell state is located within the interference interval for Bin 0, then the L0 adjacent cell state is assigned to Bin 0. If the interference value reflecting interference on the target cell for the L1 adjacent cell state falls within the interference interval for Bin 1, then the L1 adjacent cell state is assigned to Bin 1. A similar process can be performed to assign the remaining adjacent cell states L2-L7.

If there are any empty bins, this means that the interference intervals initially defined for each bin were suboptimal. To address this, the controller can perform an interference interval redefinition process. As will be described in further detail herein, the interference interval redefinition process modifies the initial interference intervals defined for the bins in an attempt to ensure that each bin is assigned at least one adjacent cell state. The controller can repeat the interference interval redefinition process until each bin is assigned to at least one adjacent cell state. Upon determining that there are no empty bins, the controller can determine a set of read level offsets, where each read level offset is defined for a respective bin. For example, for each bin, the read level offset can be determined from an average of the values reflecting interference on the target cell of the adjacent cell states assigned to the bin. The controller can then cause a read operation to be performed using the read level offsets to read the target cell. Further details regarding implementing balanced corrective read are described herein below with reference to FIGS. 1-7.

Advantages of the present disclosure include, but are not limited to, improved memory device performance and reliability. For example, since the adjacent cell states have been grouped into bins according to interference on a target cell, the set read level offsets determined for the bins are tailored to account for interference. This can result in a more accurate and efficient read operation, and improved RWB. Accordingly, embodiments described herein can be implemented to reduce read errors and increase the life of a memory device.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Pillar, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level memory cells (SLC) can store one bit per memory cell. Other types of memory cells, such as multi-level memory cells (MLCs), triple level memory cells (TLCs), quad-level memory cells (QLCs), and penta-level memory cells (PLCs) can store multiple bits per memory cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The memory device 130 can include a memory array including cells. The cells can include a target cell and a set of cells adjacent to the target cell ("adjacent cells"). The target cell can have a cell state ("target cell state"). For example, the target cell state can be a programming state (e.g., level) of the target cell. Each adjacent cell can have a cell state ("adjacent cell state"). For example, the adjacent cell state of a can be of a programming state (e.g., level) of the cell.

The local media controller 135 can implement a corrective read (CR) component 137 that can implement balanced corrective read. To implement balanced corrective read, the CR component 137 can determine, for each adjacent cell state, an interference value reflecting cell-to-cell interference ("interference") on the target cell. For example, the CR component 137 can cause the interference value reflecting interference on the target cell for each adjacent cell state to be measured. The interference can be caused by the displacement of one or more adjacent cells from an initial state to a final state, which in turn can cause a certain displacement of the target cell from its intended target cell state. In some embodiment, for each adjacent cell state, the interference value can be an amount of interference measured for the target cell. For example, for a TLC cell, there can be eight cell states L0-L7, where the target cell can have a particular one of the cell states (e.g., L1).

The CR component 137 can initialize a set of state information bins ("bins"). For example, the set of bins can include a number of bins that are initially empty. Illustratively, in a TLC implementation, the number of bins can be four. As will be described in further detail below, each adjacent cell state can be assigned to a bin in accordance with its respective interference value.

The CR component 137 can then assign each adjacent cell state to a respective bin of the set of bins based on its respective interference value. To perform the bin assignment, the CR component 137 can determine an interference interval for each bin of the set of bins. The CR component 137 can divide an interference range by the number of bins to determine a width for each interference interval, such that the width of each interference interval is equal. The interference range can be defined by, among all of the interference values, the minimum value reflecting interference on the target cell and the maximum value reflecting interference on the target cell. For each adjacent cell state, the CR component 137 can then identify the interference interval in which the interference value for the adjacent cell state is located, and assign the adjacent cell state to the bin defined by the interference interval. For example, assume a 2BCR TLC implementation in which there are four bins, Bin 1 through Bin 4. If the interference value reflecting for the L1 adjacent cell state falls within the interference interval defining Bin 1, then the L1 adjacent cell state is assigned to Bin 1.

If there are any empty bins, this means that the interference intervals defined for each bin were sub-optimal. To address this, the CR component 137 can perform an interference interval redefinition process. To perform the interference interval redefinition process, the CR component 137 can modify the interference interval of a selected bin. The selected bin can be the bin that includes the adjacent cell state determined to have the highest interference value reflecting interference on the target cell (e.g., the L7 adjacent cell state). The lower bound of the interference interval of the selected bin can be defined as the next highest interference value reflecting interference on the target cell (e.g., the L6 adjacent cell state). The CR component 137 can then remove the selected bin from the set of bins, which results in a new interference range among the remaining bins. The CR component 137 can determine a new interference interval for each of the remaining bins. For example, the CR component 137 can divide the new interference range by the number of remaining bins to determine a new width for each interference interval of the remaining bins. For each remaining adjacent cell state (e.g., L0-L6), the CR component 137 can then identify the new interference interval in which the interference value reflecting interference on the target cell for the adjacent cell state is located, and assign the adjacent cell state to the bin defined by the new interference interval. The CR component 137 can repeat the interference interval redefinition process until each bin is assigned at least one adjacent cell state.

After each bin has at least one adjacent cell state assigned to it, the CR component 137 can determine a read level offset for each bin. For example, for each bin, the read level offset can be determined from an average of the interference values. The CR component 137 can then cause a read operation to be performed on the target cell using respective ones of the read level offsets. Further details regarding the operations of the CR component 137 will be described below with reference to FIGS. 4-7.

Figure 1B:
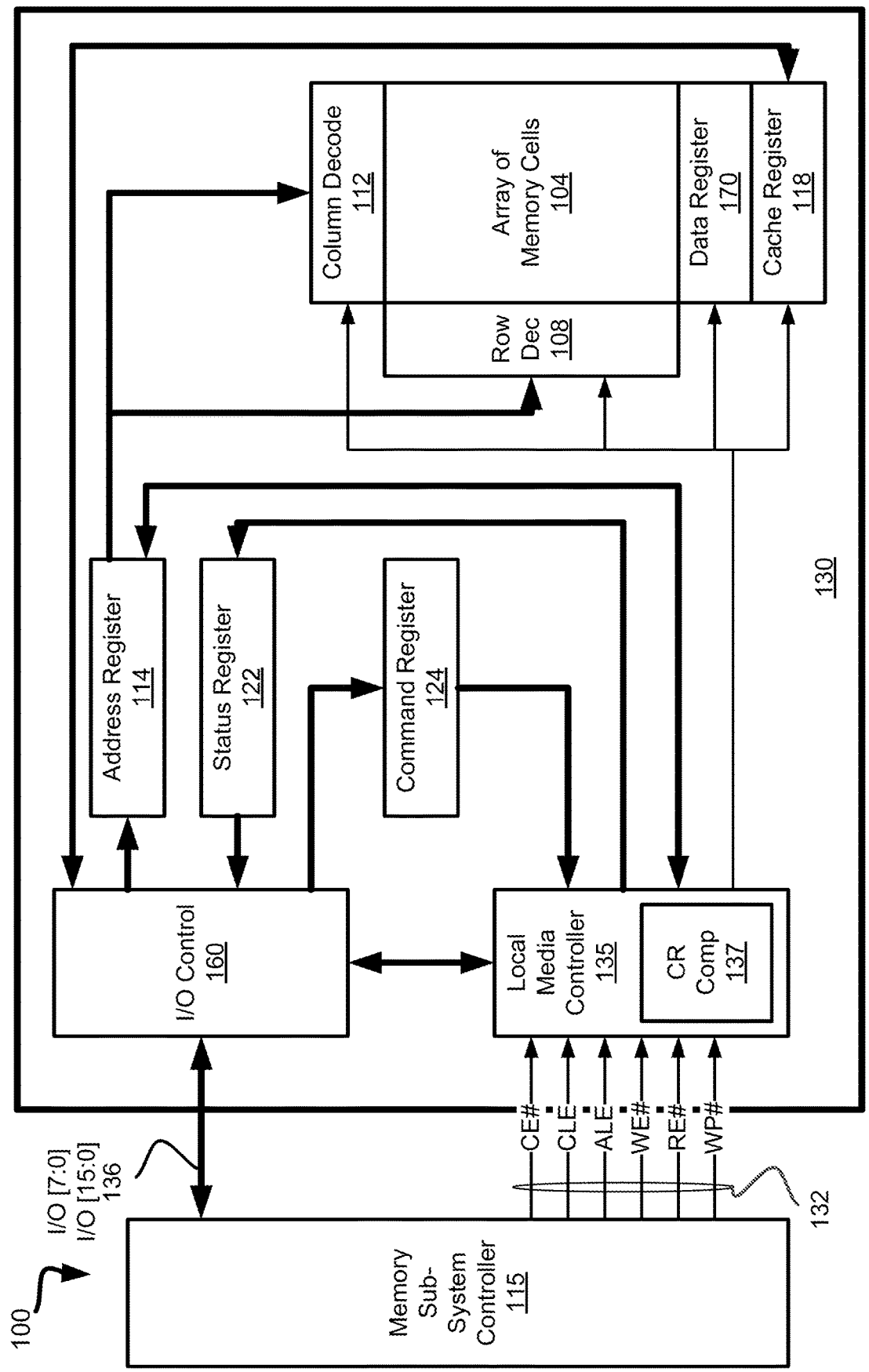
FIG. 1B is a block diagram of a memory device in communication with a memory sub-system controller of a memory sub-system, in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are connected to the same access line (e.g., a wordline) while memory cells of a logical column are selectively connected to the same data line (e.g., a bitline). A single access line may be associated with more than one logical row of memory cells and a single data line may be associated with more than one logical column. Memory cells (not shown in FIG. 1B) of at least a portion of array of memory cells 104 are capable of being programmed to one of at least two target data states.

Row decode circuitry 108 and column decode circuitry 112 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 112 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 112 to control the row decode circuitry 108 and column decode circuitry 112 in response to the addresses. In one embodiment, local media controller 135 includes the BV component 137, which can implement the defect detection described herein during an erase operation on memory device 130.

The local media controller 135 is also in communication with a cache register 118. Cache register 118 latches data, either incoming or outgoing, as directed by the local media controller 135 to temporarily store data while the array of memory cells 104 is busy writing or reading, respectively, other data. During a program operation (e.g., write operation), data may be passed from the cache register 118 to the data register 170 for transfer to the array of memory cells 104; then new data may be latched in the cache register 118 from the I/O control circuitry 160. During a read operation, data may be passed from the cache register 118 to the I/O control circuitry 160 for output to the memory sub-system controller 115; then new data may be passed from the data register 170 to the cache register 118. The cache register 118 and/or the data register 170 may form (e.g., may form a portion of) a page buffer of the memory device 130. A page buffer may further include sensing devices (not shown in FIG. 1B) to sense a data state of a memory cell of the array of memory cells 204, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 136 and outputs data to the memory sub-system controller 115 over I/O bus 136.

For example, the commands may be received over input/output (I/O) pins [7:0] of I/O bus 136 at I/O control circuitry 160 and may then be written into command register 124. The addresses may be received over input/output (I/O) pins [7:0] of I/O bus 136 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 118. The data may be subsequently written into data register 170 for programming the array of memory cells 104.

In an embodiment, cache register 118 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIGS. 1A-1B has been simplified. It should be recognized that the functionality of the various block components described with reference to FIGS. 1A-1B may not necessarily be segregated to distinct components or component portions of an integrated circuit device. For example, a single component or component portion of an integrated circuit device could be adapted to perform the functionality of more than one block component of FIGS. 1A-1B. Alternatively, one or more components or component portions of an integrated circuit device could be combined to perform the functionality of a single block component of FIGS. 1A-1B. Additionally, while specific I/O pins are described in accordance with popular conventions for receipt and output of the various signals, it is noted that other combinations or numbers of I/O pins (or other I/O node structures) may be used in the various embodiments.

Figure 2A:
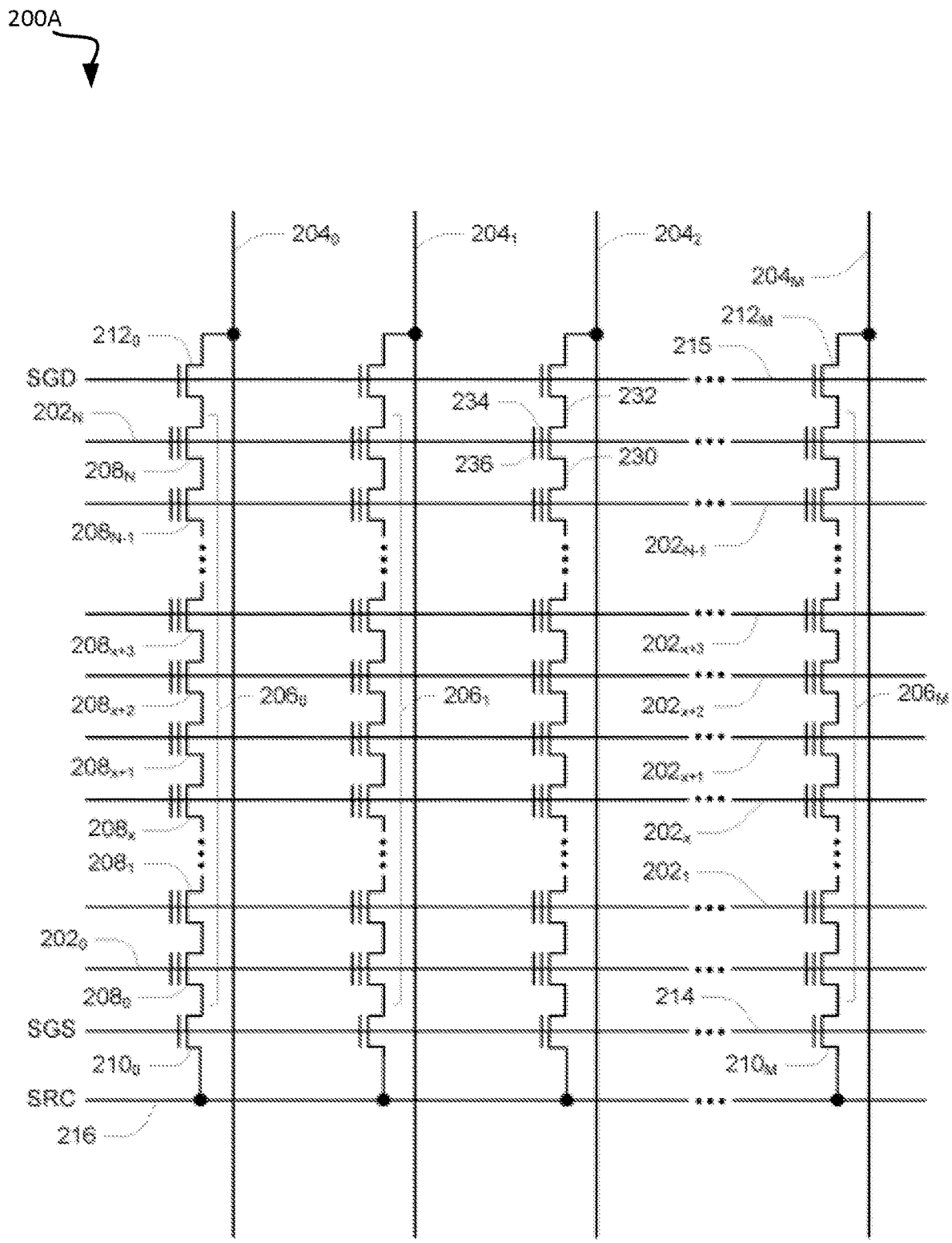
FIGS. 2A-2C are diagrams of portions of an example array of memory cells included in a memory device, in accordance with some embodiments of the present disclosure.
Figure 2B:
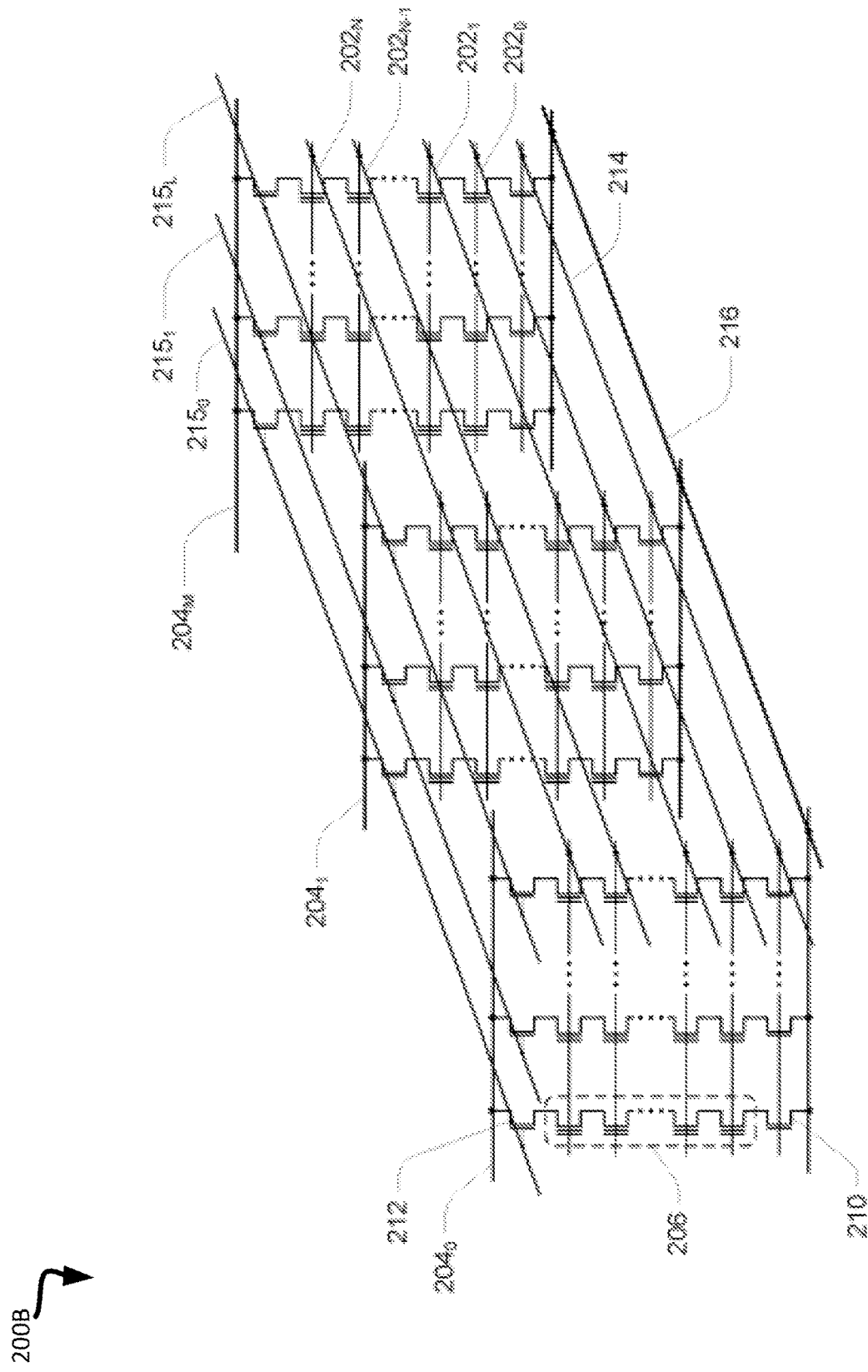
Figure 2C:
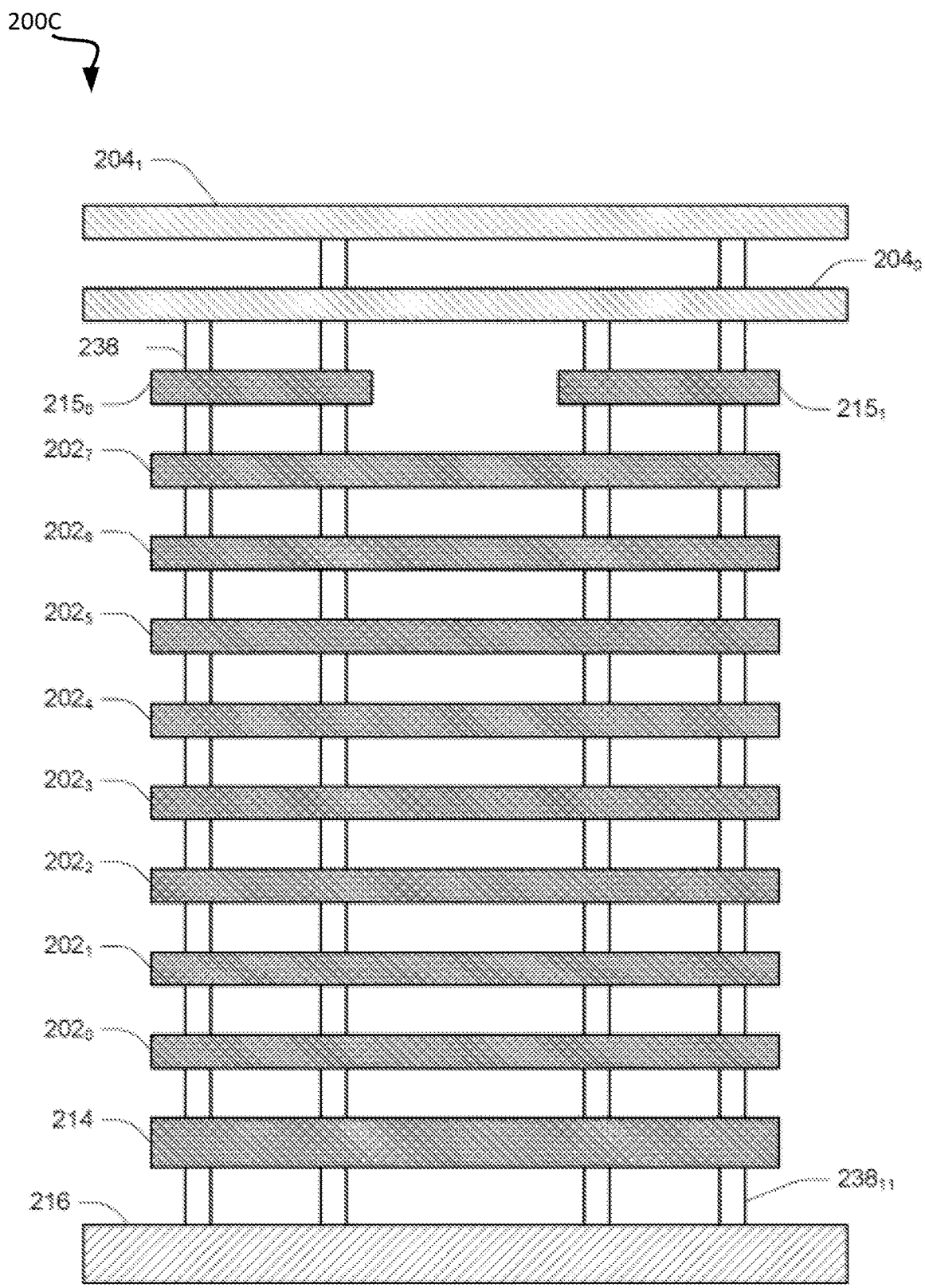

FIGS. 2A-2C are diagrams of portions of an example array of memory cells included in a memory device, in accordance with some embodiments of the present disclosure. For example, FIG. 2A is a schematic of a portion of an array of memory cells 200A as could be used in a memory device (e.g., as a portion of array of memory cells 104). Memory array 200A includes access lines, such as wordlines $202_0$ to $202_N$, and a data line, such as bitline 204. The wordlines 202 may be connected to global access lines (e.g., global wordlines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A can be arranged in rows each corresponding to a respective wordline 202 and columns each corresponding to a respective bitline 204. Rows of memory cells 208 can be divided into one or more groups of physical pages of memory cells 208, and physical pages of memory cells 208 can include every other memory cell 208 commonly addressable by a given wordline 202. For example, memory cells 208 commonly addressable by wordline $202_N$ and selectively connected to even bitlines 204 (e.g., bitlines $204_0$, $204_2$, $204_4$, etc.) may be one physical page of memory cells 208 (e.g., even memory cells) while memory cells 208 commonly addressable by wordline $202_N$ and selectively connected to odd bitlines 204 (e.g., bitlines $204_1$, $204_3$, $204_5$, etc.) may be another physical page of memory cells 208 (e.g., odd memory cells). Although bitlines $204_3$-$204_5$ are not explicitly depicted in FIG. 2A, it is apparent from the figure that the bitlines 204 of the array of memory cells 200A may be numbered consecutively from bitline $204_0$ to bitline $204_M$. Other groupings of memory cells 208 commonly addressable by a given wordline 202 may also define a physical page of memory cells 208. For certain memory devices, all memory cells commonly addressable by a given wordline might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells addressable by wordlines $202_0$-$202_N$ (e.g., all strings 206 sharing common wordlines 202). Unless expressly distinguished, a reference to a page of memory cells herein refers to the memory cells of a logical page of memory cells.

Each column can include a string of series-connected memory cells (e.g., non-volatile memory cells), such as one of strings $206_0$ to $206_M$. Each string 206 can be connected (e.g., selectively connected) to a source line 216 (SRC) and can include memory cells $208_0$ to $208_N$. The memory cells 208 of each string 206 can be connected in series between a select gate 210, such as one of the select gates $210_0$ to $210_M$, and a select gate 212, such as one of the select gates $212_0$ to $212_M$. In some embodiments, the select gates $210_0$ to $210_M$ are source-side select gates (SGS) and the select gates $212_0$ to $212_M$ are drain-side select gates. Select gates $210_0$ to $210_M$ can be connected to a select line 214 (e.g., source-side select line) and select gates $212_0$ to $212_M$ can be connected to a select line 215 (e.g., drain-side select line). The select gates 210 and 212 might represent a plurality of select gates connected in series, with each select gate in series configured to receive a same or independent control signal. A source of each select gate 210 can be connected to SRC 216, and a drain of each select gate 210 can be connected to a memory cell $208_0$ of the corresponding string 206. Therefore, each select gate 210 can be configured to selectively connect a corresponding string 206 to SRC 216. A control gate of each select gate 210 can be connected to select line 214. The drain of each select gate 212 can be connected to the bitline 204 for the corresponding string 206. The source of each select gate 212 can be connected to a memory cell $208_N$ of the corresponding string 206. Therefore, each select gate 212 might be configured to selectively connect a corresponding string 206 to the bitline 204. A control gate of each select gate 212 can be connected to select line 215.

In some embodiments, and as will be described in further detail below with reference to FIG. 2B, the memory array in FIG. 2A is a three-dimensional memory array, in which the strings 206 extend substantially perpendicular to a plane containing SRC 216 and to a plane containing a plurality of bitlines 204 that can be substantially parallel to the plane containing SRC 216.

FIG. 2B is another schematic of a portion of an array of memory cells 200B (e.g., a portion of the array of memory cells 104) arranged in a three-dimensional memory array structure. The three-dimensional memory array 200B may incorporate vertical structures which may include semiconductor pillars where a portion of a pillar may act as a channel region of the memory cells of strings 206. The strings 206 may be each selectively connected to a bit line $204_0$-$204_M$ by a select gate 212 and to the SRC 216 by a select gate 210. Multiple strings 206 can be selectively connected to the same bitline 204. Groups of strings 206 can be connected to their respective bitlines 204 by biasing the select lines $215_0$-$215_L$ to selectively activate particular select gates 212 each between a string 206 and a bitline 204. The select gates 210 can be activated by biasing the select line 214. Each wordline 202 may be connected to multiple rows of memory cells of the memory array 200B. Rows of memory cells that are commonly addressable by each other by a particular wordline 202 may collectively be referred to as tiers.

FIG. 2C is a diagram of a portion of an array of memory cells 200C (e.g., a portion of the array of memory cells 104). Channel regions (e.g., semiconductor pillars) 238 represent the channel regions of different strings of series-connected memory cells (e.g., strings 206 of FIGS. 2A-2B) selectively connected to the bitline $204_0$ and/or bitline $204_1$. A memory cell (not depicted in FIG. 2C) may be formed at each intersection of a wordline 202 and a channel region 238, and the memory cells corresponding to a single channel region 238 may collectively form a string of series-connected memory cells (e.g., a string 206 of FIGS. 2A-2B). Additional features might be common in such structures, such as dummy wordlines, segmented channel regions with interposed conductive regions, etc.

Figure 3:
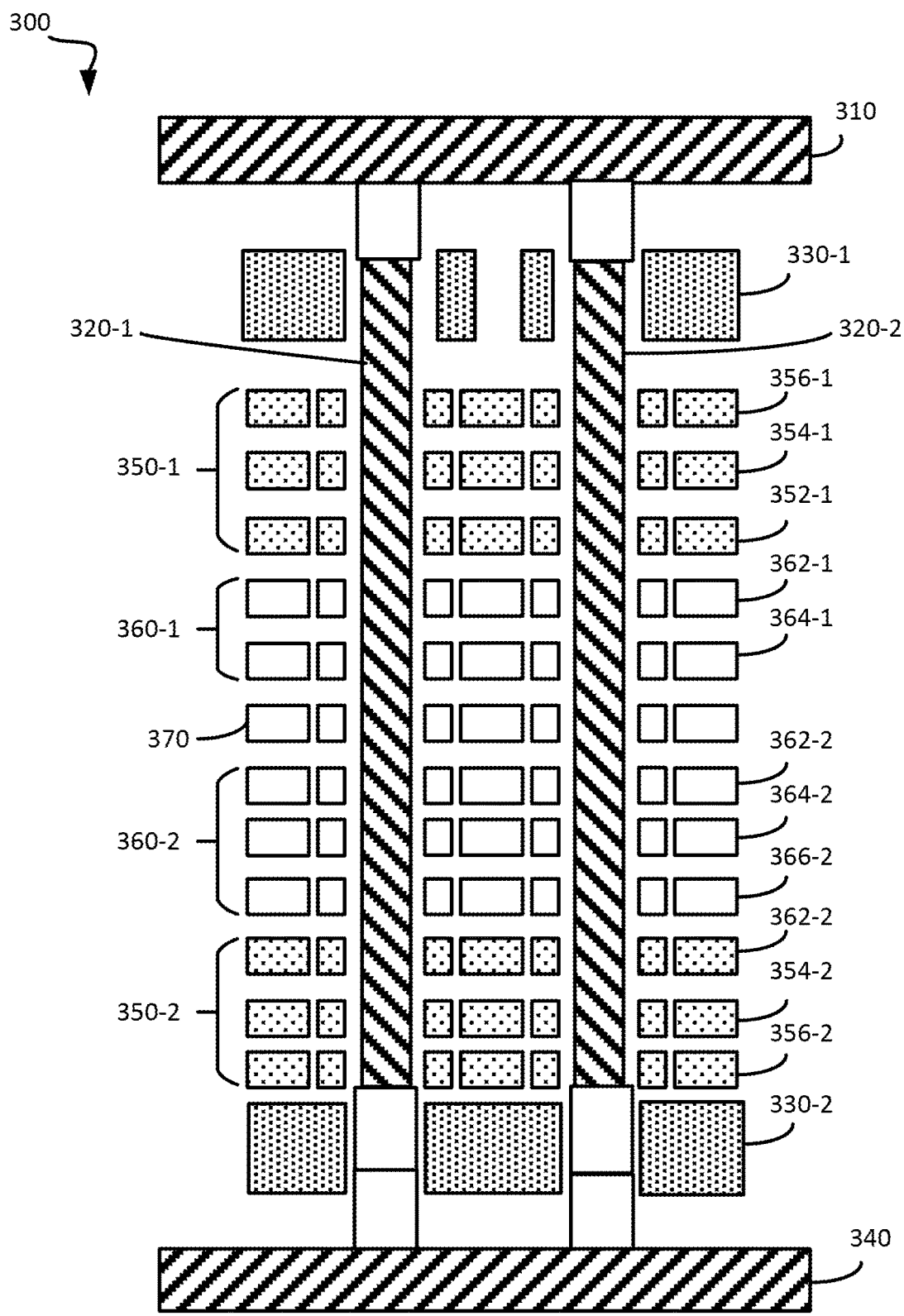
FIG. 3 is a diagram of an example three-dimensional (3D) replacement gate memory device, in accordance with some embodiments of the present disclosure.

FIG. 3 is a diagram of an example three-dimensional (3D) replacement gate memory device ("device") 300, in accordance with some embodiments of the present disclosure. However, the embodiments described herein can be applied to any suitable memory device. As shown, the device 300 includes a bitline 310, pillars 320-1 and 320-2, select gates (SGs) 330-1 and 330-2, a source line (SRC) 340, and WL groups 350-1, 350-2, 360-1 and 360-2. More specifically, WL groups 350-1 and 350-2 are dummy WL groups, and WL groups 360-1 and 360-2 are active WL groups. WL group 350-1 includes dummy WLs 352-1 through 366-1, WL group 650-2 includes dummy WLs 352-2 through 356-2, WL group 360-1 includes active WLs 362-1 and 364-1, and WL group 360-2 includes active WLs 362-2, 364-2 and 366-2. However, such an example should not be considered limiting. A dummy WL corresponds to memory cells that do not store data and are included to satisfy processing margins, while an active WL corresponds to memory cells that store data.

As further shown, a WL 370 is provided. In some embodiments, the device 300 is a multiple deck device, in which WL groups 350-1 and 360-1 are associated with a first deck (e.g., an upper deck) of the device 300 and the WL groups 350-2 and 360-2 are associated with a second deck (e.g., a lower deck) of the device 300, such that the WL 370 corresponds to a dummy WL separating the WL groups 360-1 and 360-2. In other embodiments, the device 300 is a "single deck" device, in which the WL groups 360-1 and 360-2 are not arranged in decks. Here, the WL 370 can be an active WL within one of the WL groups 360-1 or 360-2.

Figure 4:
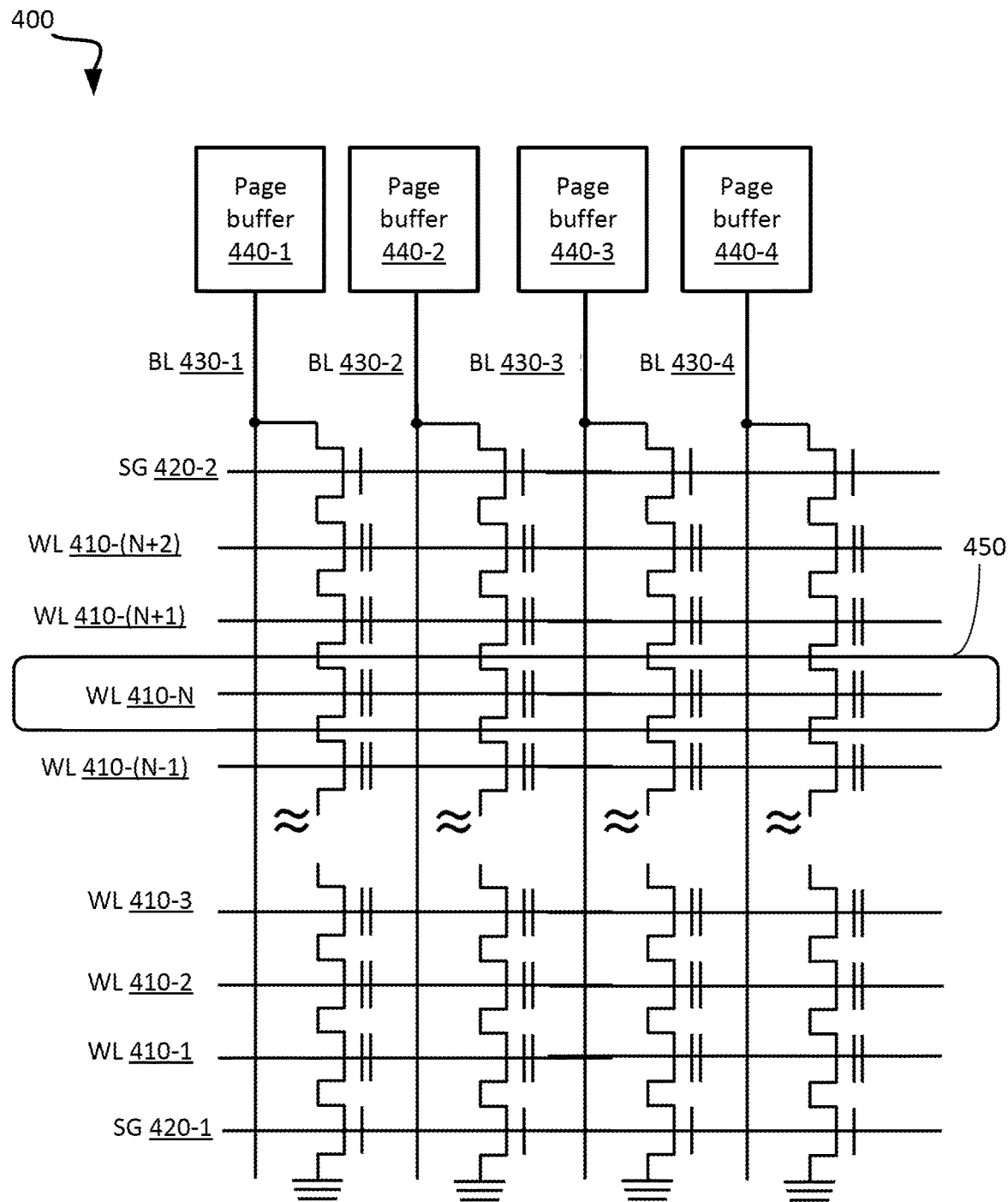
FIG. 4 is a diagram of a portion of a memory device, in accordance with some embodiments of the present disclosure.

FIG. 4 is a diagram of a portion of a memory array 400, in accordance with some embodiments. The memory array 400 can include any suitable number of wordlines (WLs). For example, as shown, the memory array 400 includes a number of wordlines WL 410-1 through WL 410-(N+2). Each of the WLs 410-1 through 410-(N+2) is connected to a respective set of cells. Each of the WLs 410-1 through 410-(N+2) is adjacent to at least one WL. For example, WL 410-(N+1) and WL 410-(N−1) are each adjacent wordlines with respect to WL 410-N. The memory array 400 further includes select gate (SG) 420-1 and SG 420-2 In some embodiments, SG 420-1 is a source-side SG (SGS) and SG 420-2 is a drain-side SG (SGD).

The memory array 400 further includes a number of bitlines (BLs) including BL 430-1 through 430-4 and a number of page buffers including page buffers 440-1 through 440-4. Each of the page buffers is connected to a respective one of the bitlines. Although only 4 bitlines 430-1 through 410-3 and page buffers 440-1 through 440-4 are shown, the memory array 400 can include any suitable number of bitlines and page buffers.

In this illustrative example, a set of target cells 450 is selected to be read. The set of target cells 450 includes a number of cells of the target wordline WL 410-N. Each target cell of the set of target cells 450 is adjacent to a pair of adjacent cells. More specifically, the pair of adjacent cells for a particular target cell includes the cell addressable by WL 410-(N+1) that is directly above the target cell, and the cell addressable by WL 410-(N−1) that is directly below the target cell. That is, a target cell of the set of target cells 450 is connected to a same one of the bitlines as its respective pair of adjacent cells. A controller (e.g., local media controller 135 of FIGS. 1A-1B) can initiate a read operation using a set of read level offsets determined using balanced corrective read, as described above with reference to FIG. 1A and as will be described in further below with reference to FIGS. 5A-7.

Figure 5A:
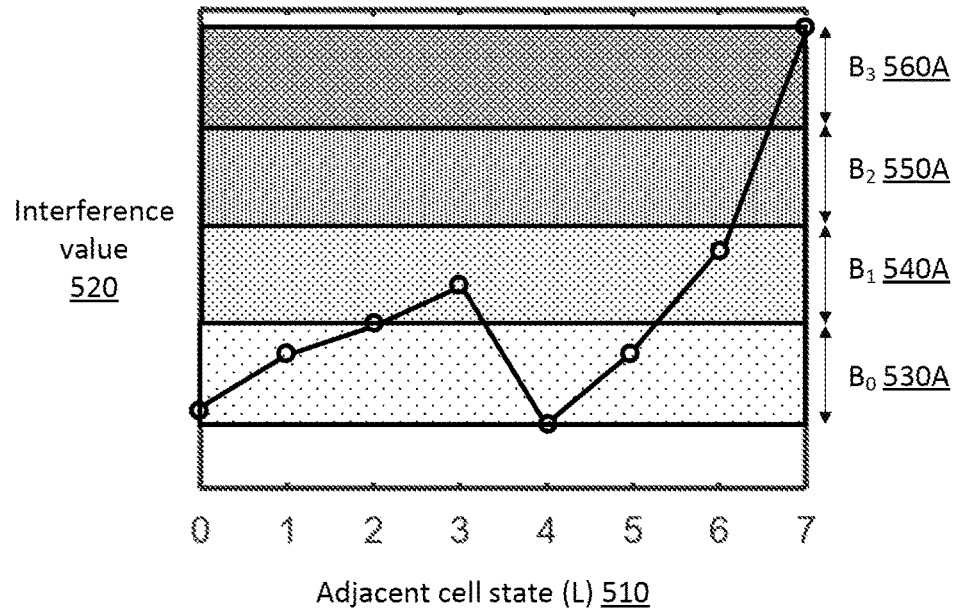
FIGS. 5A-5B are diagrams illustrating an example implementation of balanced corrective read, in accordance with some embodiments of the present disclosure.
Figure 5B:
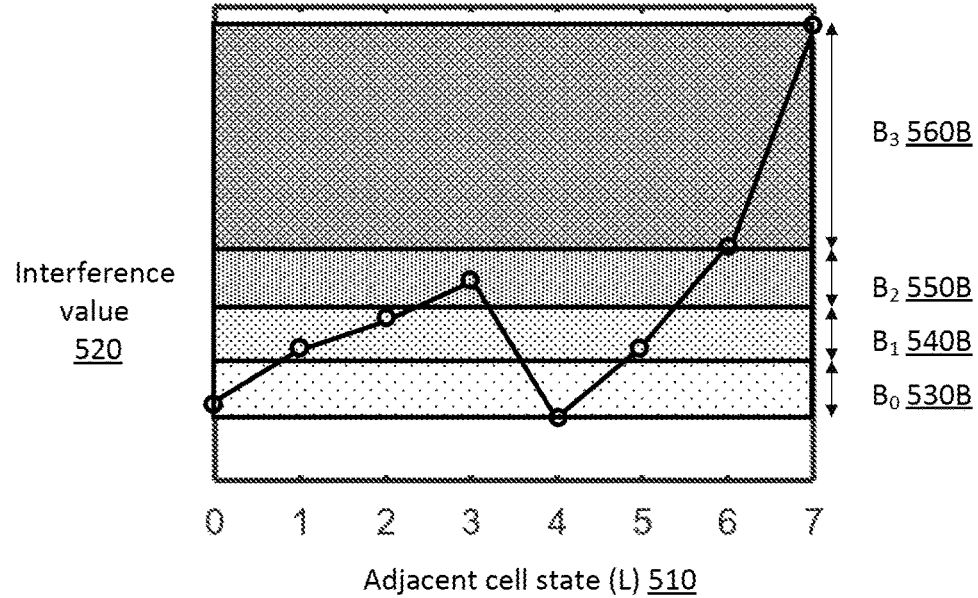

FIGS. 5A-5B are diagrams 500A-500B illustrating an example implementation of balanced corrective read, in accordance with some embodiments of the present disclosure. More specifically, diagrams 500A-500B illustrate an example implementation of balanced corrective read with respect to TLC cells programmed using two-pass programming (e.g., 2-8 two-pass programming). The diagrams 500A-500B each include an x-axis 510 representing the adjacent cell state, L0-L7 (denoted as 0-7). The diagrams 500A-500B further include a y-axis 520 representing interference values reflecting interference of adjacent cells on target cells. In some embodiments, each interference value is a respective amount of interference on the target cells. For illustrative purposes, it is assumed that the target cells are programmed to have an L1 state.

For example, the interference values on the L1 target cells can be obtained as follows. The L1 target cells can be divided into 8 subsets of L1 target cells, where each subset of L1 target cells defines a respective adjacent cell state. In this illustrative example, there are 8 subsets of L1 target cells. More specifically, one subset of L1 target cells can include target cells adjacent to L0 cells, another subset of L1 target cells can include target cells adjacent to L1 cells . . . , and a final subset of L1 target cells can include target cells adjacent to L7 cells. Each of these subsets defines a respective $V_T$ sub-distribution, and the overall $V_T$ distribution of L1 target cells is given by a mixture of the $V_T$ sub-distributions. Each of these $V_T$ sub-distributions can be "cut" within its upper tail, at a level which is representative of ECC error correction capability of the memory device The cut can be represented by a horizontal line located at a particular probability level. For each $V_T$ sub-distribution, the $V_T$ value corresponding to the cut can be recorded and plotted as a function of the adjacent cell state of the respective subset of L1 target cells.

In FIG. 5A, it is assumed that that interference value for each adjacent cell state has been determined, a set of bins including four bins (Bin 0 through Bin3) has been initialized, and respective interference intervals B0 530A through B3 560A have been determined for Bin 0 through Bin 3. For example, at least one controller (e.g., local media control 135 of FIGS. 1A-1B) can determine the interference value for each adjacent cell state, initialize the set of bins, and/or determine the interference intervals B0 530A through B3 560A. In determining the interference intervals 530A-560A, the controller can determine an interference range and divide the interference range into the interference intervals 530A-560A, such that each of the interference intervals 530A-560A has an equal width. The interference range can be defined using the minimum interference value (i.e., the interference value reflecting interference on the target cell for adjacent cell state L4) and the maximum interference value (i.e., the interference value reflecting interference on the target cell for adjacent cell state L7). Accordingly, the interference range is equal to the sum of the interference intervals 530A-560A.

As further shown in FIG. 5A, each interference value can fall within one of the interference intervals 530A-560A. As mentioned above, each of the interference intervals 530A-560A is defined for a respective one of the bins Bin 0 through Bin 3. Thus, the controller can assign each adjacent cell state to the bin defined by the corresponding one of the interference intervals 530A-560A. In this illustrative example, Bin 0 can include L0, L1, and L4, Bin 1 can include L2, L3 and L6, Bin 2 is an empty bin, and Bin 3 can include L7. Alternatively, Bin 0 can include L0, L1, L2, and L4, Bin 1 can include L3 and L6, Bin 2 is an empty bin, and Bin 3 can include L7. Alternatively, Bin 0 can include L0, L1, and L2, Bin 1 can include L3, L4 and L6, Bin 2 is an empty bin, and Bin 3 can include L7.

If there were no empty bins, then this means that the bin assignment was successful and the controller could proceed with obtaining a read level offset for each bin. However, in this illustrative example, Bin 2 is an empty bin since no adjacent cell state had been assigned to it. This means that the interference intervals 530A-560A shown in FIG. 5A were sub-optimal. To address this, the controller can perform an interference interval redefinition process.

To perform the interference interval redefinition process, the controller can modify the interference interval of a selected bin to obtain a modified interference interval. The selected bin can be the bin that includes the adjacent cell state determined to have the highest interference value reflecting interference on the target cell. In this illustrative example, the selected bin is Bin 3 defined by the interference interval 560A, which includes the L7 adjacent cell state.

As shown in FIG. 5B, the lower bound of the modified interference interval, 560B, is defined by the interference value reflecting interference on the target cell for the L6 adjacent cell state. Bin 3 can then be removed from the set of bins for the purpose of redefining the interference intervals, 530B-550B, for the remaining bins Bin 0 through Bin 2, respectively. Moreover, the L7 adjacent cell state can be assigned to Bin 3 and the interference value reflecting interference on the target cell for the L7 adjacent cell state can be removed for the purpose of redefining the interference intervals 530B-550B.

In determining the interference intervals 530B-550B, the controller can determine an interference range and divide the interference range into the interference intervals 530B-550B, such that each of the interference intervals 530A-560A has an equal width. The interference range can be defined using the minimum interference value reflecting interference on the target cell among the remaining interference values (i.e., the interference value reflecting interference on the target cell for adjacent cell state L4) and the maximum interference value reflecting interference on the target cell among the remaining interference values (i.e., the interference value reflecting interference on the target cell for adjacent cell state L6).

As further shown in FIG. 5B, for each of the remaining adjacent cell states L0-L6, the respective interference value can fall within one of the interference intervals 530B-550B. Thus, the controller can assign each remaining adjacent cell state to the bin defined by the corresponding one of the interference intervals 530B-550B. In this illustrative example, Bin 0 can include L0 and L4, Bin 1 can include L1, L2, and L5, Bin 2 can include L3 and L6, and Bin 3 can include L7. Alternatively, Bin 2 can include L3 and Bin 3 can include L6 and L7.

The interference interval redefinition process resulted in zero empty bins (i.e., each of Bin 0 through Bin 3 has been assigned at least one of the adjacent cell states L0-L7). This means that the bin assignment resulting from the redefined interference intervals 530B-560B is successful and the controller could proceed with obtaining a read level offset for each bin. For example, the controller can determine the read level offset for a bin based on the average of the interference values assigned to the bin. Illustratively, if Bin 0 includes L0 and L4, Bin 1 includes L1, L2, and L5, Bin 2 includes L3 and L6, and Bin 3 includes L7, the read level offset for Bin 0 can be determined as the average of the interference values for adjacent cell states L0 and L4, the read level offset for Bin 1 can be determined as the average of the interference values for adjacent cell states L1, L2, and L5, the read level offset for Bin 2 can be determined as the average of the interference values for adjacent cell states L3 and L6, and the read level offset for Bin 3 can be determined as the interference value for adjacent cell state L7. The read level offsets can then be used to perform a read operation, at least on the target cell.

As mentioned above, it is assumed that the target cell is programmed having an L1 state. A similar process can be performed to analyze interference and determine read level offsets for target cells programmed to other states. Further details regarding implementing balanced corrective read are described above with reference to FIGS. 1A and 4 and will be described in further detail below with reference to FIGS. 6-8.

Figure 6:
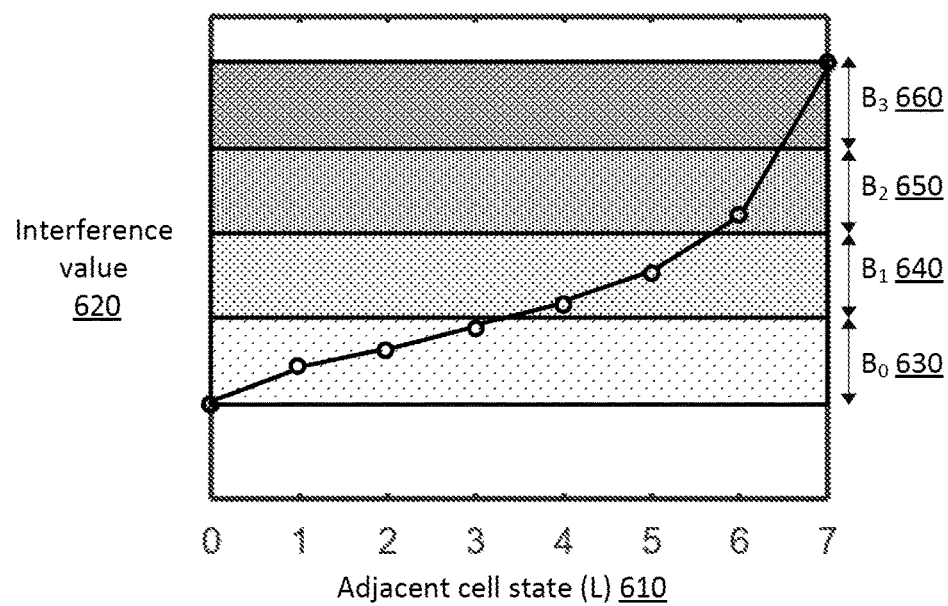
FIG. 6 is a diagram illustrating an example implementation of balanced corrective read, in accordance with some embodiments of the present disclosure.

FIG. 6 is a diagram 600 illustrating an example implementation of balanced corrective read, in accordance with some embodiments of the present disclosure. More specifically, diagram 600 illustrates an implementation of balanced corrective read with respect to TLC cells programmed using one-pass programming. The diagram 600 includes an x-axis 610 representing the adjacent cell state, L0-L7 (denoted as 0-7). The diagram 600 further includes a y-axis 620 representing interference values reflecting interference on target cells. In some embodiments, each interference value is a respective amount of interference. For illustrative purposes, it is assumed that the target cells are programmed to have an L1 state. Due to the one-pass programming, as shown in diagram 600, the interference value monotonically increases from L0 to L7. The interference values on the target cells can be obtained by cutting $V_T$ sub-distributions, as described above with reference to FIG. 5A.

Similar to FIG. 5A, diagram 600 further shows interference intervals B0 630 through B3 660 each determined for a respective bin, Bin 0 through Bin 3. Each of the adjacent cell states L0-L7 can have a respective interference value reflecting interference on the target cell, and a controller (e.g., local media controller 135 of FIGS. 1A-1B) can assign each adjacent cell state to a respective bin depending on which of the interference intervals 630-660 that the respective interference value falls into. In this illustrative example, Bin 0 can include L0-L3, Bin 1 can include L4 and L5, Bin 2 can include L6, and Bin 3 can include L7. Here, each of the bins Bin 0 through Bin 3 has at least one adjacent cell state assigned to it, and thus an interference interval redefinition process need not be performed.

As mentioned above, it is assumed that the target cell is programmed having an L1 state. A similar process can be performed to determine read level offsets for reading target cells programmed to other states. Further details regarding implementing balanced corrective read are described above with reference to FIGS. 1A, 4 and 5A-5B and will be described in further detail below with reference to FIG. 7.

Figure 7:
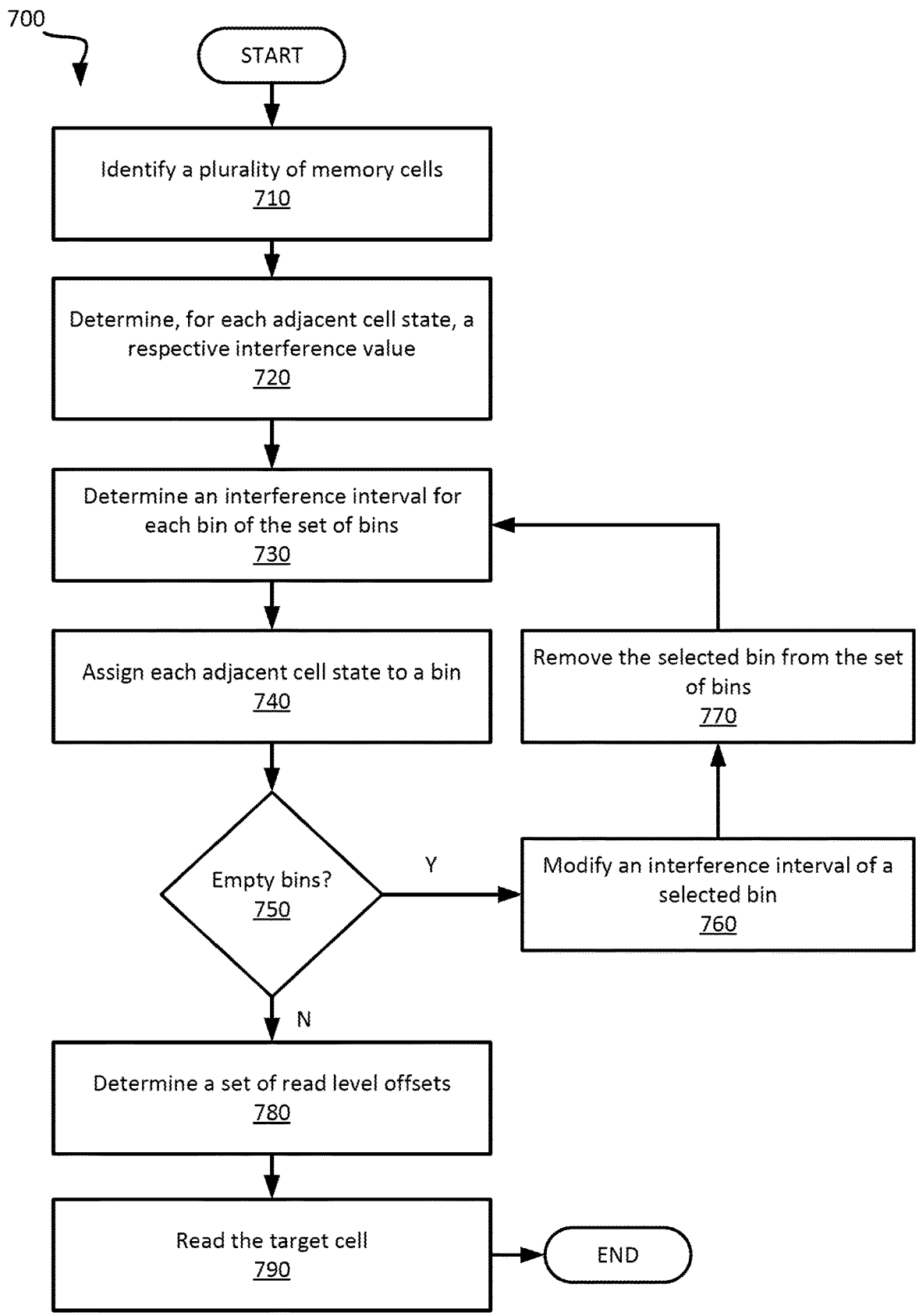
FIG. 7 is a flow diagrams of an example method to implement balanced corrective read, in accordance with some embodiments of the present disclosure.

FIG. 7 is a flow diagram of an example method 700 to implement balanced corrective read, in accordance with some embodiments of the present disclosure. The method 700 can be performed by control logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by the CR component 137 of FIGS. 1A-1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 710, a plurality of memory cells is identified. For example, control logic can identify a target cell and a set of cells adjacent to the target cells. Each cell of the set of cells has an adjacent cell state. Each adjacent cell state can reflect a logical level (e.g., programming state) of a respective cell of the set of cells. The target cell can be programmed to a particular target cell state. For example, for a TLC cell, there can be eight cell states L0-L7, where the target cell and each cell of the set of cells can have a particular one of the adjacent cell states.

At operation 720, a respective interference value is determined for each adjacent cell state. For example, control logic can cause, for each adjacent cell state, the respective interference value to be determined, where each interference value reflects interference on the target cell. In some embodiments, each interference value is a respective amount of interference that the respective cell state has on the target cell.

At operation 730, an interference interval can be determined for each bin of a set of bins. For example, control logic can divide an interference range by a number of bins to determine each interference interval, such that all interference intervals have an equal width. The interference range can be defined by a minimum interference value among all of the interference values, and a maximum interference value among all of the interference values. The number of bins can determined in accordance with the corrective read implementation (e.g., the number of bins is equal to $2^B$, where B is the number of bits of cell state information used to perform the corrective read implementation).

At operation 740, each adjacent cell state is assigned to a bin. For example, for each cell state, control logic can identify the interference interval in which the respective interference value is located, and assign the adjacent cell state to a respective bin defined by the interference interval. For example, assume a 2BCR TLC implementation in which there are four bins, Bin 0 through Bin 3. If the interference value reflecting interference on the target cell for an L0 adjacent cell state falls within the interference interval defining Bin 0, then the L0 adjacent cell state is assigned to Bin 0.

At operation 750, it is determined whether any empty bins exist. For example, control logic can determine whether at least one bin of the set of bins does not have at least one adjacent cell state assigned to it. If any empty bins exist, this means that the interference intervals assigned to the bins was sub-optimal, and an interference interval redefinition process can be performed.

To perform the interference interval redefinition process, at operation 760, an interference interval of a selected bin is modified. For example, control logic can identify the selected bin as the bin that includes the adjacent cell state determined to have the highest interference value reflecting interference on the target cell (e.g., the L7 adjacent cell state, as shown in FIGS. 5A-5B), and modify the lower bound of the interference interval of the selected bin. The lower bound of the interference interval of the selected bin can be defined as the next highest interference value reflecting interference on the target cell (e.g., the L6 adjacent cell state, as shown in FIGS. 5A-5B).

At operation 770, the selected bin can be removed from the set of bins. For example, control logic can then remove the selected bin from the set of bins to obtain a modified set of bins. Thus, the modified set of bins has one fewer bin than the set of bins (e.g., the set of bins includes four bins, then the modified set of bins includes three bins).

The process can revert back to operation 730 to determine a new interference interval for each bin of the modified set of bins. For example, the removal of the selected bin defines a new interference range among the modified set of bins, and the processing logic can divide the new interference range by the number of bins of the modified set of bins to determine a new width for each new interference interval. The process can continue through operation 750 to determine whether any empty bins exist among the modified set of bins.

If no empty bins are determined to exist at operation 750 (i.e., each bin of the set of bins or each bin of the modified set of bins is assigned with at least one adjacent cell state), this means that the bin assignment is complete. At operation 760, a set of read level offsets for reading the target cell is determined. For example, control logic can obtain, for each bin having at least one assigned adjacent cell state, a respective read level offset based on the at least one interference value determined for the at least one assigned adjacent cell state. In some embodiments, the respective read level offset is determined for each bin based on an average of the values reflecting interference on the target cell for the assigned cell states (e.g., an average of the amounts of interference).

At operation 790, the target cell is read. For example, control logic can cause at least the target cell to be read using the set of read level offsets. Further details regarding operations 710-790 are described above with reference to FIGS. 1A and 4-6.

Figure 8:
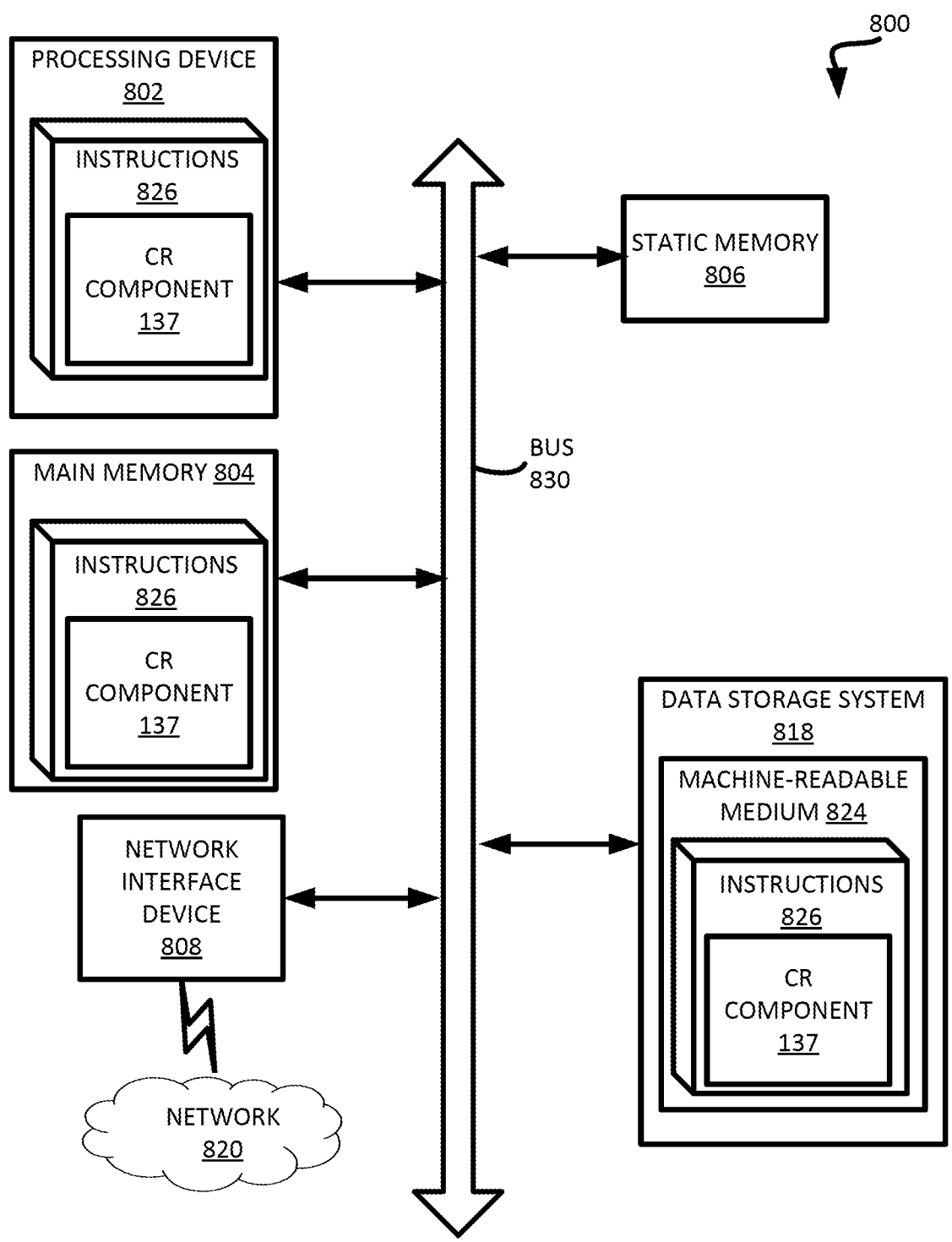
FIG. 8 is a block diagram of an example computer system in which embodiments of the present disclosure may operate.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the CR component 137 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a memory cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or RDRAM, etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1A.

In one embodiment, the instructions 826 include instructions to implement functionality corresponding to a CR component (e.g., the CR component 137 of FIG. 1A). While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
a memory array; and
control logic, operatively coupled with the memory array, to perform operations comprising:
identifying, from the memory array, a target cell and a set of cells adjacent to the target cell, wherein each cell of the set of cells is associated with a respective adjacent cell state, and wherein each adjacent cell state reflects a logical level of the respective cell;
determining, for each adjacent cell state, a respective interference value reflecting cell-to-cell interference on the target cell;
assigning, based on the respective interference value, each adjacent cell state to a respective bin of a set of state information bins;
determining whether each bin of the set of state information bins has at least one adjacent cell state assigned to it; and
in response to determining that each bin of the set of state information bins has at least one adjacent cell state assigned to it, determining a set of read level offsets for reading the target cell, wherein each read level offset of the set of read level offsets is associated with a respective bin of the set of state information bins.

2. The memory device of claim 1, wherein the operations further comprise causing the target cell to be read using the set of read level offsets.

3. The memory device of claim 1, wherein the operations further comprise determining, for each bin of the set of state information bins, a respective interference interval associated with the bin.

4. The memory device of claim 3, wherein determining the interference interval for each bin of the set of state information bins comprises dividing an interference range of the set of bins by a number of bins of the set of state information bins, and wherein the interference range is defined by a minimum interference value among each interference value and a maximum interference value among each interference value.

5. The memory device of claim 3, wherein assigning each adjacent cell state to a bin of the set of state information bins comprises:
identifying the interference interval in which the respective interference value for the adjacent cell state is located; and
assigning the adjacent cell state to the bin defined by the interference interval.

6. The memory device of claim 1, wherein the operations further comprise, in response to determining that at least one bin of the set of state information bins is an empty bin, performing an interference interval redefinition process comprising:
- modifying an interference interval of a selected bin of the set of state information bins;
- removing the selected bin from the set of state information bins to obtain a modified set of state information bins; and
- determining a new interference interval for each bin of the modified set of state information bins.

7. The memory device of claim 6, wherein:
- modifying the interference interval of the selected bin comprises modifying a lower bound of the interference interval of the selected bin; and
- determining the new interference interval for each bin of the modified set of state information bins comprises dividing an interference range of the modified set of state information bins by a number of bins of the modified set of state information bins.

8. A method comprising:
- identifying, by a processing device from a memory array, a target cell and a set of cells adjacent to the target cell, wherein each cell of the set of cells is associated with a respective adjacent cell state, and wherein each adjacent cell state reflects a logical level of the respective cell
- determining, by the processing device for each adjacent cell state, a respective interference value reflecting cell-to-cell interference on the target cell;
- assigning, by the processing device based on the respective interference value, each adjacent cell state to a respective bin of a set of state information bins;
- determining, by the processing device, whether each bin of the set of state information bins has at least one adjacent cell state assigned to it; and
- in response to determining that each bin of the set of state information bins has at least one adjacent cell state assigned to it, determining, by the processing device, a set of read level offsets for reading the target cell, wherein each read level offset of the set of read level offsets is associated with a respective bin of the set of state information bins.

9. The method of claim 8, further comprising causing, by the processing device, the target cell to be read using the set of read level offsets.

10. The method of claim 8, further comprising determining, by the processing device for each bin of the set of state information bins, a respective interference interval defined for the bin.

11. The method of claim 10, wherein determining the interference interval for each bin of the set of state information bins comprises dividing an interference range of the set of bins by a number of bins of the set of state information bins, and wherein the interference range is defined by a minimum interference value among each interference value and a maximum interference value among each interference value.

12. The method of claim 10, wherein assigning each adjacent cell state to a bin of the set of state information bins comprises:
- identifying the interference interval in which the respective interference value for the adjacent cell state is located; and
- assigning the adjacent cell state to the bin defined by the interference interval.

13. The method of claim 8, further comprising, in response to determining that at least one bin of the set of state information bins is an empty bin, performing, by the processing device, an interference interval redefinition process comprising:
- modifying an interference interval of a selected bin of the set of state information bins;
- removing the selected bin from the set of state information bins to obtain a modified set of state information bins; and
- determining a new interference interval for each bin of the modified set of state information bins.

14. The method of claim 13, wherein:
- modifying the interference interval of the selected bin comprises modifying a lower bound of the interference interval of the selected bin; and
- determining the new interference interval for each bin of the modified set of state information bins comprises dividing an interference range of the modified set of state information bins by a number of bins of the modified set of state information bins.

15. A memory device comprising:
- a memory array comprising a target cell and a set of cells adjacent to the target cell, wherein each cell of the set of cells is associated with a respective adjacent cell state, and wherein each adjacent cell state reflects a logical level of the respective cell; and
- control logic, operatively coupled with the memory array, to perform operations comprising:
  - maintaining a set of state information bins;
  - determining, for each bin of the set of state information bins, an interference interval associated with the bin;
  - assigning, based on a respective interference interval identified for each adjacent cell state, the adjacent cell state to a respective bin of the set of state information bins;
  - determining whether each bin of the set of state information bins has at least one adjacent cell state assigned to it; and
  - in response to determining that each bin of the set of state information bins has at least one adjacent cell state assigned to it, determining a set of read level offsets, wherein each read level offset of the set of read level offsets is associated with a respective bin of the set of state information bins.

16. The memory device of claim 15, wherein the operations further comprise causing the target cell to be read using the set of read level offsets.

17. The memory device of claim 15, wherein the operations further comprise determining, for each adjacent cell state, the respective interference value.

18. The memory device of claim 15, wherein determining the interference interval for each bin of the set of state information bins comprises dividing an interference range of the set of bins by a number of bins of the set of state information bins, and wherein the interference range is defined by a minimum interference value among each interference value and a maximum interference value among each interference value.

19. The memory device of claim 15, wherein the operations further comprise, in response to determining that at least one bin of the set of state information bins is an empty bin, performing an interference interval redefinition process comprising:
- modifying an interference interval of a selected bin of the set of state information bins;
- removing the selected bin from the set of state information bins to obtain a modified set of state information bins; and determining a new interference interval for each bin of the modified set of state information bins.

20. The memory device of claim 19, wherein:

modifying the interference interval of the selected bin comprises modifying a lower bound of the interference interval of the selected bin; and determining the new interference interval for each bin of the modified set of state information bins comprises dividing an interference range of the modified set of state information bins by a number of bins of the modified set of state information bins.

\* \* \* \* \*